(12) United States Patent
Yi

(10) Patent No.: US 9,843,754 B1
(45) Date of Patent: Dec. 12, 2017

(54) GLOBAL SHUTTER PIXEL WITH HYBRID TRANSFER STORAGE GATE-STORAGE DIODE STORAGE NODE

(71) Applicant: OMNIVISION TECHNOLOGIES, INC., Santa Clara, CA (US)

(72) Inventor: Xianmin Yi, Menlo Park, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 42 days.

(21) Appl. No.: 15/181,819

(22) Filed: Jun. 14, 2016

(51) Int. Cl.
*H04N 5/372* (2011.01)
*H01L 27/148* (2006.01)
*H04N 5/353* (2011.01)
*H04N 5/359* (2011.01)
*H04N 5/361* (2011.01)

(52) U.S. Cl.
CPC ... *H04N 5/37213* (2013.01); *H01L 27/14812* (2013.01); *H01L 27/14831* (2013.01); *H04N 5/3532* (2013.01); *H04N 5/3597* (2013.01); *H04N 5/361* (2013.01)

(58) Field of Classification Search
CPC ............ H04N 5/37213; H04N 5/3532; H04N 5/3597; H04N 5/361; H01L 27/14812; H01L 27/14831
See application file for complete search history.

(56) References Cited

U.S. PATENT DOCUMENTS

| | | | | |
|---|---|---|---|---|
| 5,304,803 | A * | 4/1994 | Sakaino | H01L 27/1465 250/332 |
| 6,770,860 | B1 * | 8/2004 | O | H04N 5/3692 250/208.1 |
| 2013/0250150 | A1 * | 9/2013 | Malone | G02B 15/00 348/262 |
| 2014/0146209 | A1 | 5/2014 | Wan et al. | |
| 2014/0211056 | A1 * | 7/2014 | Fan | H01L 27/14643 348/308 |
| 2016/0343770 | A1 * | 11/2016 | Fan | H01L 27/14643 |

OTHER PUBLICATIONS

Velichko et al., "Low Noise High Efficiency 3.75 µm and 2.8 µm Global Shutter CMOS Pixel Arrays," Aptina Imaging, Meridian, Idaho, 2013 (4 pages).

* cited by examiner

*Primary Examiner* — Nicholas Giles
(74) *Attorney, Agent, or Firm* — Christensen O'Connor Johnson Kindness PLLC

(57) ABSTRACT

An image sensor pixel having a hybrid transfer storage gate-storage diode storage node is disclosed herein. An example image sensor includes a photodiode, a storage diode, a transfer gate, and a buried storage well. The photodiode, storage diode, and buried storage well are all disposed in a semiconductor material. The transfer storage gate may be disposed on a surface of the semiconductor material between the photodiode and the storage diode. Further, the buried storage well may be disposed under the storage diode and partially under the transfer storage gate. Additionally, a length of the transfer storage gate and a length of the storage diode may be equal, and the storage diode may passivate a surface of the semiconductor material between the transfer storage gate and an output gate.

20 Claims, 3 Drawing Sheets

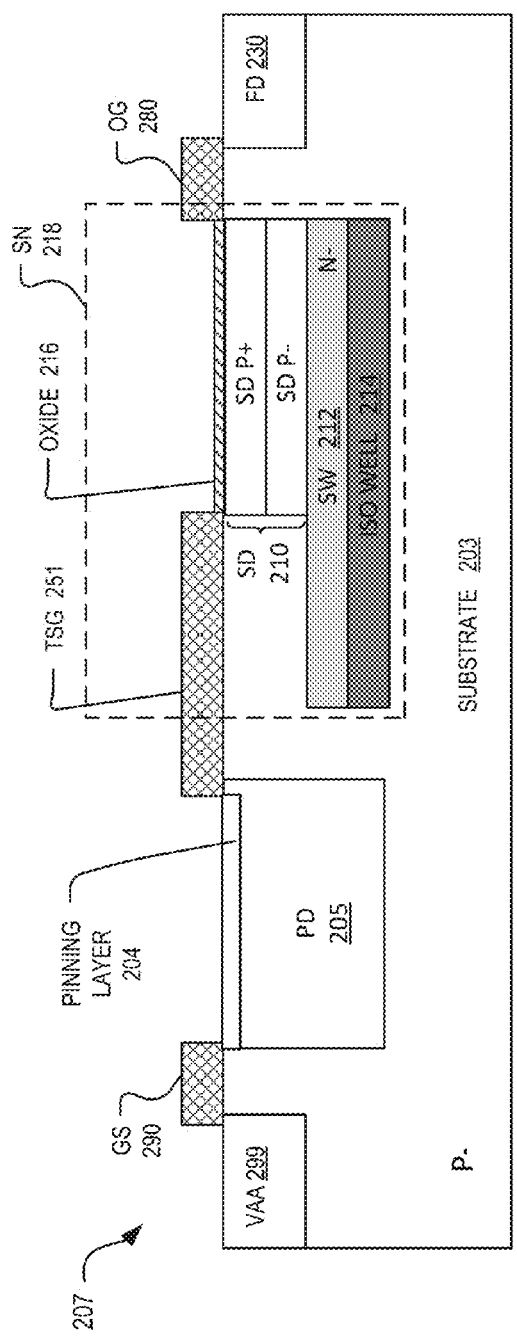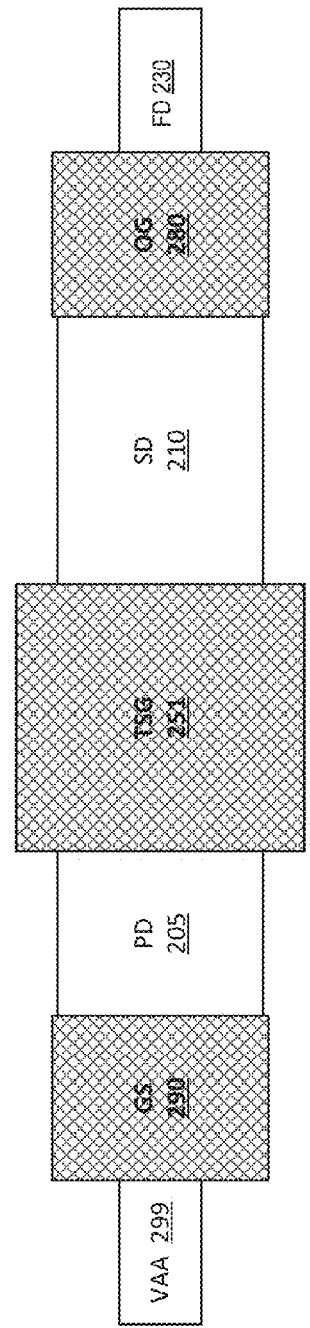
FIG. 2A
FIG. 2B

GLOBAL SHUTTER PIXEL WITH HYBRID TRANSFER STORAGE GATE-STORAGE DIODE STORAGE NODE

TECHNICAL FIELD

This disclosure relates generally to image sensor pixels, and in particular but not exclusively, relates to image sensor pixel storage nodes.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors that operate in a global shutter mode, e.g., simultaneous exposure of all pixels, may be affected by various problems, such as dark current and ghost images. The dark current, for example, may increase the power consumption of the image sensors without adding any benefits, e.g., it is wasted energy. The ghost images may be seen as a memory effect of the pixels due to charge generated during an exposure remaining behind in the pixel, which causes noise in subsequent exposures. There, however, may be tradeoffs in addressing each issue, such that low dark current may not help with the ghost images, and vice versa.

Many techniques have been employed to mitigate the effects of the dark current and ghost effects while enhancing image sensor performance. However, some of these techniques may not entirely eliminate the effects due, at least in part, to the tradeoffs.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 2A is a cross-section illustration of an example pixel that includes multiple storage nodes, in accordance with an embodiment of the disclosure.

FIG. 2B is a plan view of a layout of an example pixel that includes multiple storage nodes, in accordance with an embodiment of the disclosure.

Figure 1:
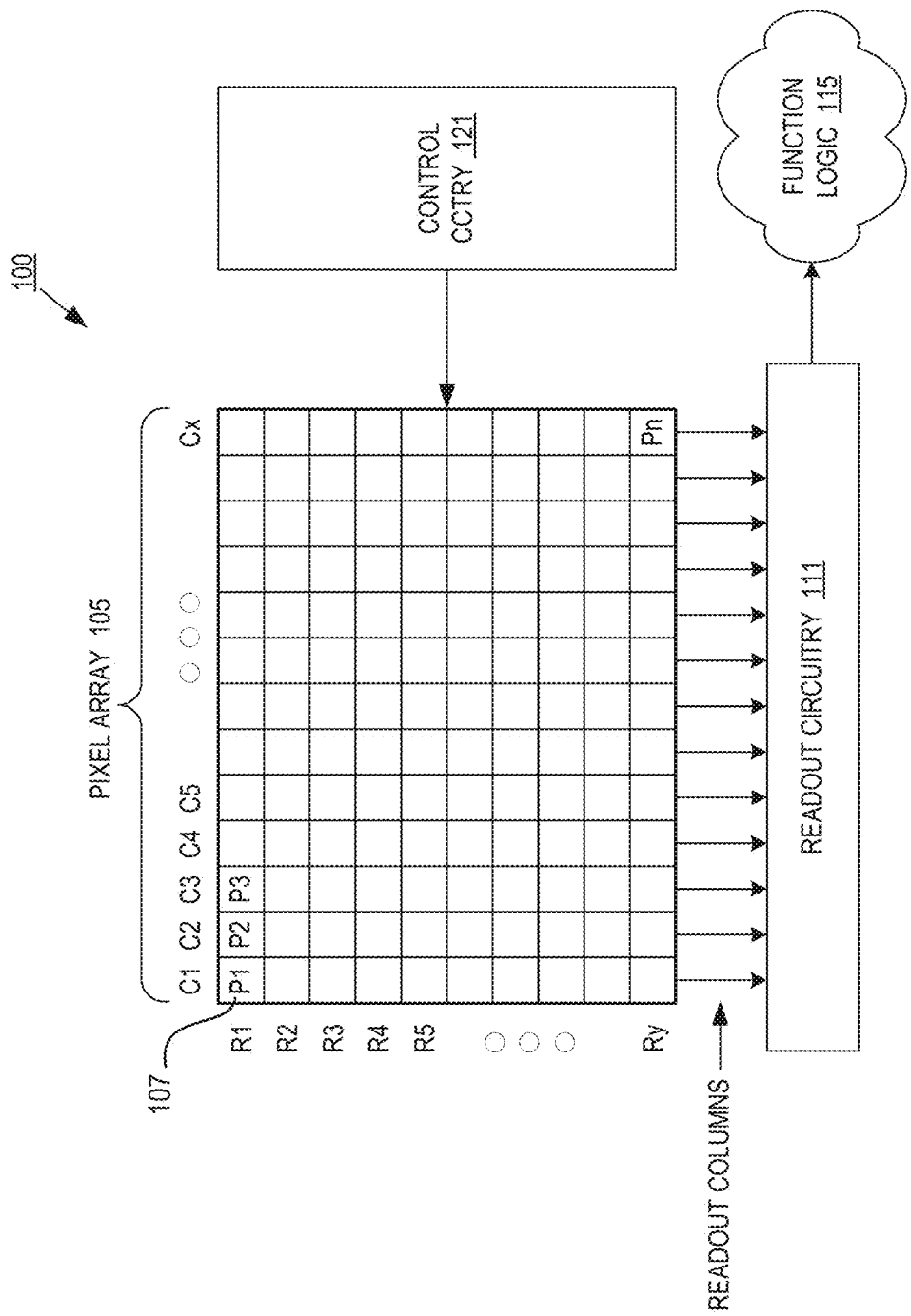
FIG. 1 is a block diagram illustrating one example of an imaging system, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with reduced dark current and reduced ghosting due to a hybrid storage node are described herein. An example hybrid storage node may at least include a storage transfer gate and storage diode that store image charge, where the combination of the storage transfer gate and the storage diode reduce or eliminate ghosting and the inclusion of the storage diode reduces dark current. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 105, control circuitry 121, readout circuitry 111, and function logic 115. In one example, pixel array 105 is a two-dimensional (2D) array of photodiodes, or image sensor pixels 107 (e.g., pixels P1, P2 . . . , Pn). As illustrated, pixels 107 are arranged into rows (e.g., rows R1 to Ry) and columns (e.g., column C1 to Cx) to acquire image data of a person, place, object, etc., which can then be used to render a 2D image of the person, place, object, etc. However, it is appreciated that the photodiodes included in pixels 107 do not have to be arranged into rows and columns and may take other configurations.

In one example, after each photodiode included in each image sensor pixel 107 in pixel array 105 has acquired its image data or image charge, the image data is readout by readout circuitry 111 and then transferred to function logic 115. Readout circuitry 111 may be coupled to readout image data from the plurality of photodiodes in pixel array 105. In various examples, readout circuitry 111 may include amplification circuitry, analog-to-digital (ADC) conversion circuitry, or otherwise. Function logic 115 may simply store the image data or even manipulate the image data by applying post image effects (e.g., crop, rotate, remove red eye, adjust brightness, adjust contrast, or otherwise). In one example, readout circuitry 111 may readout a row of image data at a time along readout column lines (illustrated) or may readout the image data using a variety of other techniques (not illustrated), such as a serial readout or a full parallel readout of all pixels simultaneously.

In one example, control circuitry 121 is coupled to pixel array 105 to control operation of the plurality of photodiodes included in the pixels 107 in pixel array 105. For example, control circuitry 121 may generate a shutter signal for controlling image acquisition. In one example, the shutter signal is a global shutter signal for simultaneously enabling all pixels 107 within pixel array 105 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

FIG. 2A is a cross-section illustration of an example pixel 207 that includes a hybrid transfer storage gate-storage diode and FIG. 2B is a plan view of an example layout of pixel 207, both in accordance with an embodiment of the present disclosure. The examples shown in FIGS. 2A and 2B are for illustrative purposes only and should not be considered limiting. For example, the example layout shown in FIG. B is just one layout of many contemplated layouts. Pixel 207 can be used as pixels 107 in pixel array 105. Pixel 207 includes a global shutter ("GS") gate 290, a pinning layer 204, a photodiode ("PD") 205, a transfer storage gate ("TSG") 251, a storage diode ("SD") 210, a buried storage well ("SW") 212, a buried isolation well ("ISO WELL") 214, a hybrid storage node ("SN") 218, an output gate ("OG") 280, and a floating diffusion ("FD") 230. Pixel 207 is disposed within a substrate 203, which, in some embodiments, may be a P doped semiconductor substrate. Photodiode 205, storage well 212, and floating diffusion 230 may be doped opposite of substrate 203, in some embodiments. For example, photodiode 205, storage well 212, and floating diffusion 230 may be doped N-type. The various doping designations, however, are a non-limiting aspect of the present disclosure.

The storage diode 210 may store charge transferred from the photodiode 205. Further, the storage diode 210 may reduce dark current generation in the area of the pixel 207 between the TSG 251 and the output gate 280. Storage diode 210 may include two layers—SD P+ and SD P−. Layer SD P+ may be disposed close to a surface of the substrate 203 and may be moderately doped. For example, the P doping in SD P+ may be around $10e^{12}$ per $cm^3$. Layer SD P− may be disposed under layer SD P+ and may be lightly doped. For example, the P doping in SD P− may be around $10e^{11}$ per $cm^3$. The two layers of storage diode 210 may form a diode between the storage well 212 and the surface of the substrate 203. Further, the higher doping of the SD P+ layer may reduce or eliminate dark current generated at an interface of the substrate 203 and the oxide 216. In some embodiments, the doping of the SD P+ layer may form a pinning layer at the surface of the substrate 203, which may reduce dark current. Additionally, the SD P+ layer may trap hot electrons that contribute to dark current. Further, because the SD P− layer is lightly doped, a depletion region formed at the interface between SD P+ and SD P− may extend further into the layer SD P− than the layer SD P+. In some embodiments, charge stored by the storage diode 210 may be stored, or at least partially stored, in the depletion region.

The buried storage well 212 may store charge, and may be a moderately doped N-type layer formed in the substrate 203. For example, charge transferred from the photodiode 205 may be stored, e.g., held, by the storage well 212. In the illustrated example of FIG. 2A, storage well 212 is formed under storage diode 210 and extends laterally under at least a portion of TSG 251. The storage well 212 may not extend all the way to photodiode 205 so that charge generated in photodiode 205 does not transfer to storage well 212 until a desired time. The buried storage well 212 may be moderately doped N type. The ISO well 214, which is disposed under the storage well 212, may be a highly doped P well for isolating the pixel 207, or at least the storage node 218, from other pixels 207 of a pixel array.

A combination of the storage diode 210, the storage well 212, and at least a portion of TSG 251 may form a hybrid storage node ("SN") 218. The hybrid storage node 218 may have a charge storage capacity that, at equilibrium, may be greater than or equal to a charge storage capacity of the photodiode 205. At equilibrium may refer to the various layers in an unbiased state so that their energy bands are at an equilibrium condition based on the various doping profiles of the components of the pixel 207. In some embodiments, the charge storage capacity of the hybrid storage node 218 may be a combination of the charge storage capacity of the storage diode 210 and the charge storage capacity of the storage well 212. The charge storage capacity of the storage node 218 may be selected so that all of the charge generated in the photodiode 205 due to an exposure, for example, may be transferred to the storage node 218. By transferring all of the charge, ghosting may be reduced or eliminated. As used herein, "ghosting" may be an image artifact caused by charge from an exposure remaining in the pixel, which may produce ghost images of previous exposures. Ghosting may also be referred to as a ghost image. One mechanism for the occurrence of ghosting may be due to charge not able to be held by a storage node moving back to the photodiode 205 and remaining there until a subsequent transfer occurs.

The TSG 251 may be a polysilicon gate disposed on a top surface of the substrate 203. While not shown, a layer of oxide, such as the oxide 216, may extend under the TSG 251 and between the TSG 251 and the substrate 203. In some embodiments, the oxide 216 may extend across the entire top surface of the substrate 203, and be disposed under the TSG 251, the output gate 280, and the global shutter gate 290. The TSG 251 may have a size, e.g., an area, based on a length and a width. With regards to FIG. 2A, length may extend along the page whereas a width may extend into the page. In some embodiments, it may be desirable to have the size of the TSG 251 to be relatively large, at least with respect to the output gate 280 and the global shutter gate 290, so that the TSG 251 has a charge pumping characteristic. As used herein, "charge pumping" characteristic or capability may refer to the ability to quickly move charge from the photodiode 205 to storage node 218, for example. Stated another way, the charge pumping capability of TSG 251 may reduce a charge energy barrier between the photodiode 205 and the storage node 218, such that charge transfer is improved. As such, the charge pumping capability of the TSG 251 may be such that all the charge generated by the photodiode 205, due to an exposure for example, may be quickly transferred to the storage node 218.

Additionally, a length of the TSG 251 and a length of the storage diode 210 may be substantially commensurate. For example, the lengths of the TSG 251 and the storage diode 210 may have a 1 to 1 ratio. While a width of the TSG 251 may be large (see FIG. 2B) with respect to the storage diode 210, the storage diode 210 may have a width based on various other design rules. For example, it may be desirable for the width of the storage diode 210 to be similar to a width of the output gate 280 to limit lag associated with transferring charge from the storage node 218 to the floating diffusion 230. However, because the storage diode 210 may reduce dark current, the length of the storage diode 210 may be extended beyond what may be conventionally chosen, and the extended length may provide additional charge storage capacity. And, due to the additional charge storage capacity, ghost images may be reduced or eliminated.

Extending the length of the storage diode 210, however, may cause the length of the TSG 251 to be reduced if an overall area of the pixel 207 is to be maintained. Reducing the length of TSG 251, however, may impact the charge pumping capability of the TSG 251. Yet, by increasing the width of the TSG 251 and selecting a length that is roughly equal to the length of the storage diode 210, the charge pumping capability of the TSG 251 may be preserved. Further, the size of the TSG 251 and the storage well 212 may add to the overall charge storage capacity of the storage node 218. As such, the charge storage capacities of the photodiode 205 and the storage node 218 may be commensurate. Consequently, the tradeoff between dark current and ghosting may be addressed by optimizing the respective sizes, e.g., lengths, of the storage diode 210 and TSG 251, so that both dark current reduction and ghosting reduction may be realized.

Figure 2C:
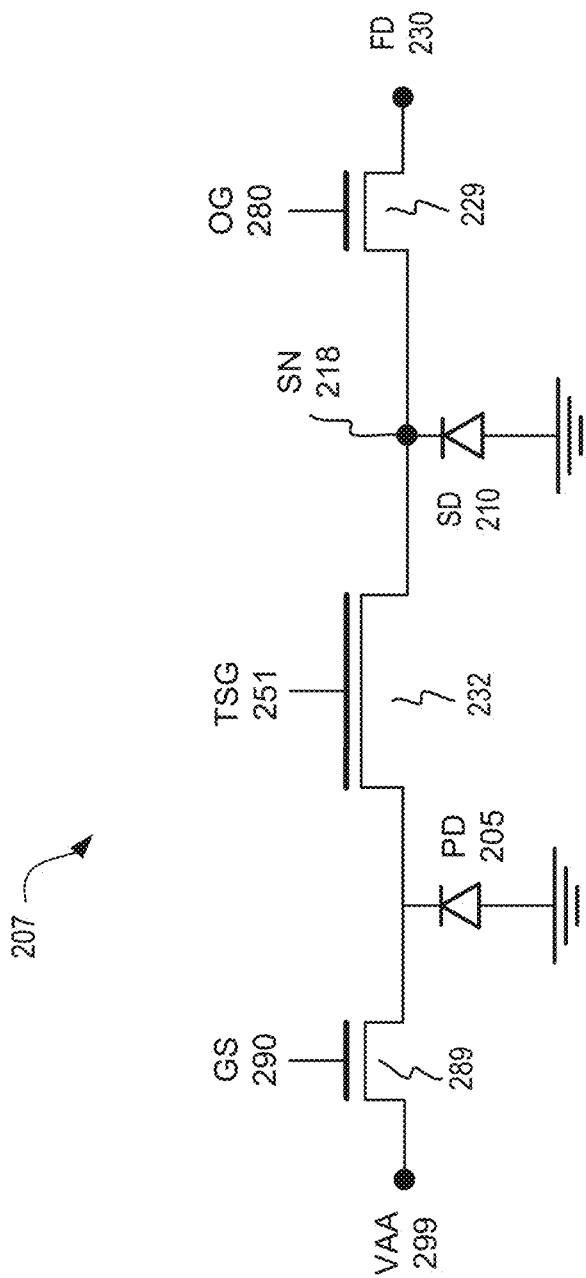
FIG. 2C is a schematic illustrating an electrical modeling of the example pixel of FIG. 2A, in accordance with an embodiment of the disclosure.

FIG. 2C is a schematic illustrating an electrical model of pixel 207, in accordance with an embodiment of the disclosure. Transistor 289 includes global shutter gate 290. When transistor 289 is activated (e.g., by a digital high voltage on shutter gate 290), photodiode 205 may be pre-charged to voltage $V_{AA}$ 299, which may be a reference voltage. Transistor 232 includes TSG 251. When transistor 232 is activated (e.g., by a digital high voltage on TSG 251), image charge generated by photodiode 205 may be transferred to storage node 218. Storage node 218 may include the storage diode 210, the storage well 212, and at least a portion of TSG 251. Transistor 229 includes output gate 280. When transistor 229 is activated (e.g., by a digital high voltage on output gate 280), image charge may be transferred from storage node 218 to floating diffusion 230.

Photodiode 205 is configured to generate image charge in response to receiving image light, for example during a global shutter operation. In FIG. 2A, a P doped pinning layer 204 is disposed above photodiode 205 to form a pinned photodiode. Also in FIG. 2A, TSG 251 is disposed over a portion of the storage well 212 and next to the storage diode 210. Storage diode 210 is disposed within the substrate 203 between TSG 251 and the output gate 280. This configuration allows pixel 207 to generate less dark current and to reduce or eliminate ghosting artifacts.

When transistor 232 is activated, a channel may be formed under TSG 251. The channel may allow charge to be transferred from the photodiode 205 to the storage node 218. For example, the channel may allow charge to flow from the photodiode 205 to the buried storage well 212 and the storage diode 210. In some embodiments, the charge flowing to the storage diode 210 may be stored, or at least partially stored, in the depletion region formed in the storage diode 210. After the charge is transferred, the transistor 232 may be deactivated so to eliminate the channel.

Because the charge storage capacity of the storage node 218 is equal to or greater than the charge storage capacity of the photodiode 205, ghosting effects may be limited. For example, if the charge storage capacity of the storage node 218 was less than the charge storage capacity of the photodiode 205, then charge may flow back into the photodiode 205 during charge transfer after the storage node 218 becomes full of charge. On the other hand, because the charge storage capacity of the storage node 218 and the photodiode 205 are roughly equal, the occurrence of ghosting may be reduced or eliminated.

To transfer the charge from the storage node 218 to the floating diffusion 230, transistor 229 may be activated. When transistor 229 is activated, a channel may form under the output gate 280 that extends from the storage node 218 to the floating diffusion 230. Upon formation of the channel, the charge stored in the storage diode 210 and the storage well 212 may flow to the floating diffusion 230. Additionally, because a width of the storage diode 210 is commensurate with a width of the output gate 280, any lag associated with charge transfer to the floating diffusion 230 may be reduced or eliminated.

While not shown in FIG. 2C, a source follower transistor may amplify the image signal generated by the image charge within floating diffusion 230 and a row select transistor may be activated to bring the amplified image signal onto a readout column for readout, such as the readout columns of FIG. 1. To reset the floating diffusion 230 to a voltage VDD, a reference voltage, a reset transistor may be activated to couple the floating diffusion 230 to VDD.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:
1. An image sensor pixel, comprising:
a photodiode disposed in a semiconductor material;
a storage diode disposed in the semiconductor material;
a transfer storage gate disposed on a surface of the semiconductor material between the photodiode and the storage diode;
a buried storage well disposed in the semiconductor material, wherein the buried storage well is disposed under the storage diode and partially under the transfer storage gate,
wherein a length of the transfer storage gate and a length of the storage diode is equal, and
wherein the storage diode passivates a surface of the semiconductor material between the transfer storage gate and an output gate.

2. The image sensor pixel of claim 1, wherein a combination of the transfer storage gate and the storage diode form a storage node.

3. The image sensor pixel of claim 2, wherein a charge storage capacity of the storage node is at least equal to a charge storage capacity of the photodiode.

4. The image sensor pixel of claim 3, wherein the charge storage capacity of the storage node is a combination of a charge storage capacity of the storage diode and a charge storage capacity of the storage well.

5. The image sensor pixel of claim 1, wherein a charge energy barrier between the photodiode and the storage diode is reduced in response to the length of the transfer storage gate.

6. The image sensor pixel of claim 1, wherein lengths of the transfer storage gate and the storage diode are optimized to eliminate ghosting.

7. The image sensor pixel of claim 1, wherein a moderate P dopant implant at the surface of the semiconductor material between the transfer storage gate and an output gate passivates the surface of the semiconductor at an oxide-semiconductor interface.

8. An imaging system, comprising:
   a pixel array having a plurality of pixels formed in a semiconductor material, the pixel array, in response to a global shutter signal, to simultaneously enable the pixels within the pixel array to simultaneously generate image charge in response to image light, wherein each pixel of the plurality of pixels includes:
     a photodiode to capture the image light and generate the image charge, the photodiode formed in the semiconductor material and having a photodiode charge storage capacity;
     a storage node coupled to store the image charge, the storage node formed in the semiconductor material and having a storage node charge storage capacity, wherein the storage node passivates a surface of the semiconductor material to reduce dark current;
     a transfer storage gate coupled to transfer the image charge from the photodiode to the storage node in response to being activated, the transfer storage gate disposed on the surface of the semiconductor material and formed between the photodiode and the storage node, wherein at least a portion of the transfer storage gate is part of the storage node;
     a floating diffusion to receive the image charge, the floating diffusion disposed in the semiconductor material; and
     an output gate coupled to transfer the image charge from the storage node to the floating diffusion, the output gate disposed on the surface of the semiconductor material and formed between the storage node and the floating diffusion; and
   control circuitry coupled to the pixel array, the control circuitry to provide the global shutter signal.

9. The imaging system of claim 8, wherein the storage node includes a storage diode and a buried storage well, the storage diode disposed in the semiconductor material between the transfer storage gate and the output gate, and the buried storage well disposed in the semiconductor material under the storage diode and partially under the transfer storage gate.

10. The imaging system of claim 9, wherein the storage node charge capacity includes a storage capacity of the storage diode and a storage capacity of the buried storage well.

11. The imaging system of claim 9, wherein a moderate P dopant implant that forms a top layer of the storage diode passivates the surface of the semiconductor material at an oxide-semiconductor interface.

12. The imaging system of claim 8, wherein the storage node charge storage capacity is substantially equal to the photodiode charge storage capacity.

13. The imaging system of claim 8, wherein a length of the transfer storage gate is substantially equal to a length of a storage diode portion of the storage node, and wherein the storage node charge storage capacity is at least due to the lengths of the transfer storage gate and the storage diode portion of the storage node.

14. The imaging system of claim 8, wherein ghosting is eliminated partially in response to a size of the storage node.

15. An image sensor pixel, comprising:
    a photodiode for generating image charge in response to image light;
    a storage diode;
    a buried storage well disposed below the storage diode;
    a transfer storage gate coupled to transfer the image charge from the photodiode to the buried storage well and the storage diode,
    wherein the buried storage well is disposed under the storage diode and a portion of the transfer storage gate, and
    wherein a length of the transfer storage gate is equal to a length of the storage diode;
    a floating diffusion; and
    an output gate coupled to transfer the image charge from the buried storage well and the storage diode to the floating diffusion.

16. The image sensor pixel of claim 15, wherein the storage diode includes two differently doped regions, with a first of the two regions close to a surface of a semiconductor material, wherein the first of the two regions is doped higher than a second of the two regions, and wherein the doping of the first region passivates the surface of the semiconductor material.

17. The image sensor pixel of claim 15, further comprising an isolation well disposed below the buried storage well.

18. The image sensor pixel of claim 15, further comprising a global shutter gate coupled to selectively reset the photodiode.

19. The image sensor pixel of claim 15, wherein relative lengths of the transfer storage gate and the storage diode are optimized to eliminate ghosting.

20. The image sensor pixel of claim 15, wherein ghosting effects are reduced due to a charge pumping capability of the transfer storage gate.

* * * * *